(12) United States Patent
Paci et al.

(10) Patent No.: US 11,427,463 B2
(45) Date of Patent: Aug. 30, 2022

(54) PIEZOELECTRIC MEMS DEVICE HAVING A SUSPENDED DIAPHRAGM AND MANUFACTURING PROCESS THEREOF

(71) Applicant: STMICROELECTRONICS S.R.L., Agrate Brianza (IT)

(72) Inventors: Dario Paci, Sedriano (IT); Marco Ferrera, Concorezzo (IT); Andrea Picco, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 986 days.

(21) Appl. No.: 16/165,828

(22) Filed: Oct. 19, 2018

(65) Prior Publication Data
US 2019/0127214 A1 May 2, 2019

(30) Foreign Application Priority Data
Oct. 31, 2017 (IT) .................... 102017000124348

(51) Int. Cl.
*B81B 3/00* (2006.01)
*H01L 41/09* (2006.01)
(Continued)

(52) U.S. Cl.
CPC .......... *B81B 3/0021* (2013.01); *B81B 3/0051* (2013.01); *B81C 1/00158* (2013.01); *G02B 3/14* (2013.01); *G02B 26/0875* (2013.01); *H01L 25/16* (2013.01); *H01L 41/0973* (2013.01); *H01L 41/22* (2013.01); *H01L 41/31* (2013.01); *B81B 2201/0257* (2013.01); *B81B 2201/032* (2013.01); *B81B 2201/047* (2013.01); *B81B 2203/0127* (2013.01);
(Continued)

(58) Field of Classification Search
CPC ................ B81B 3/0021; B81B 3/0051; B81B 2201/0257; B81B 2201/032; B81B 2201/047; B81B 2203/0127; B81B 2203/0315; B81B 2207/012; G02B 3/14; G02B 26/0875; H01L 25/16; H01L 41/0973; H01L 41/22; H01L 41/31; H01L 41/1876; B81C 1/00158; B81C 2201/0116
See application file for complete search history.

(56) References Cited

U.S. PATENT DOCUMENTS 8,173,513 B2 5/2012 Villa et al.
8,304,961 B2 11/2012 Goto et al.
(Continued)

FOREIGN PATENT DOCUMENTS

EP 1577656 A1 9/2005
EP 2270892 A1 1/2011
(Continued)

*Primary Examiner* — Douglas W Owens
(74) *Attorney, Agent, or Firm* — Seed Intellectual Property Law Group LLP

(57) ABSTRACT

A MEMS device comprising a body, having a first surface and a second surface; a diaphragm cavity in the body extending from the second surface of the body; a deformable portion in the body between the first surface and the diaphragm cavity; and a piezoelectric actuator, extending on the first surface of the body, over the deformable portion. The MEMS device is characterized in that it comprises a recess structure extending in the body and delimiting a stopper portion for the deformable portion.

18 Claims, 13 Drawing Sheets

(51) Int. Cl.
  *H01L 41/22* (2013.01)
  *B81C 1/00* (2006.01)
  *H01L 41/31* (2013.01)
  *G02B 3/14* (2006.01)
  *G02B 26/08* (2006.01)
  *H01L 25/16* (2006.01)
  *H01L 41/187* (2006.01)

(52) U.S. Cl.
  CPC . *B81B 2203/0315* (2013.01); *B81B 2207/012* (2013.01); *H01L 41/1876* (2013.01)

(56) References Cited

U.S. PATENT DOCUMENTS

| | | |
|---|---|---|
| 8,796,901 B2 | 8/2014 | Huang |
| 2009/0109262 A1 | 4/2009 | Cruz-Uribe et al. |
| 2013/0130502 A1 | 5/2013 | Sparks et al. |
| 2015/0021734 A1 | 1/2015 | Kautzsch |
| 2015/0145374 A1 | 5/2015 | Xu et al. |
| 2016/0027988 A1 | 1/2016 | Nagahata |
| 2021/0300753 A1* | 9/2021 | Rasmussen ............ H04R 19/04 |
| 2021/0362189 A1* | 11/2021 | Kumar ................ B81C 1/00476 |

FOREIGN PATENT DOCUMENTS

| | | |
|---|---|---|
| WO | 2006134580 A2 | 12/2006 |
| WO | 2016007250 A1 | 1/2016 |

* cited by examiner

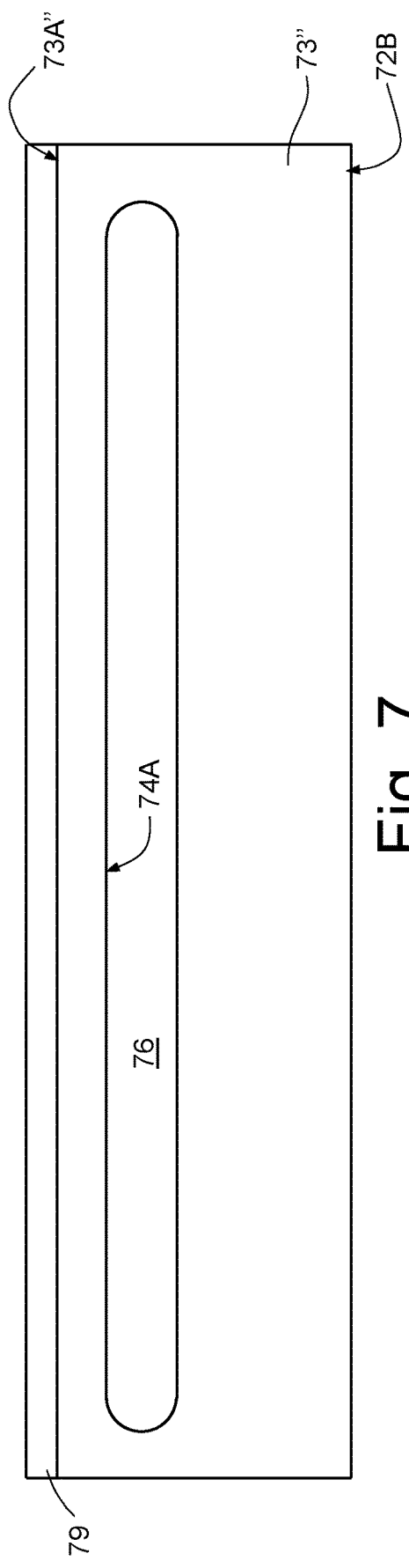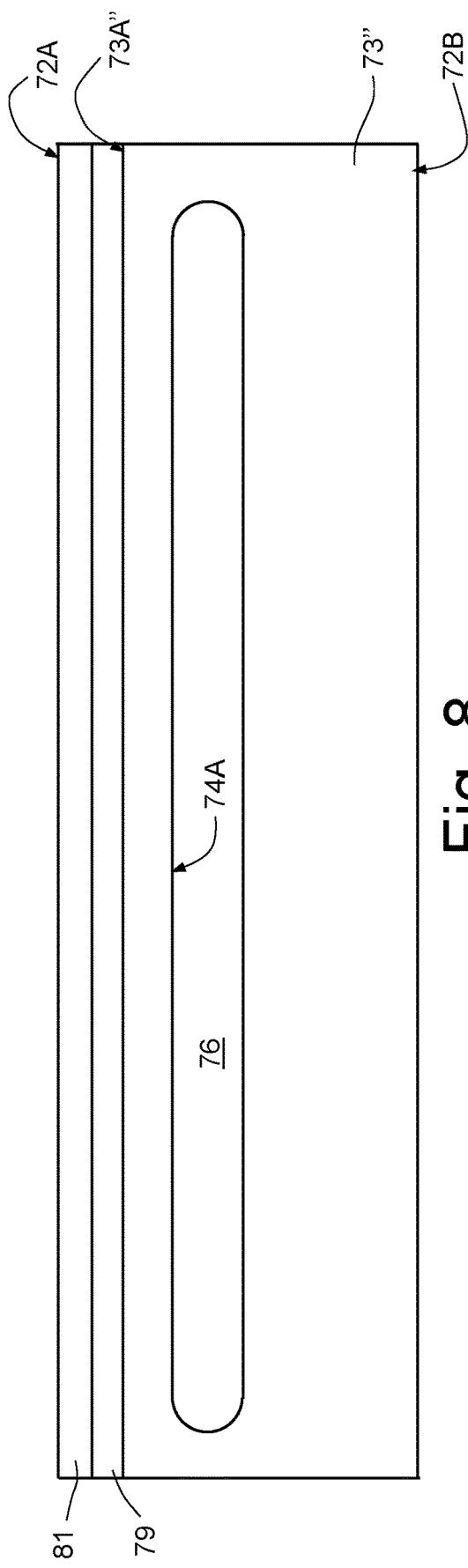

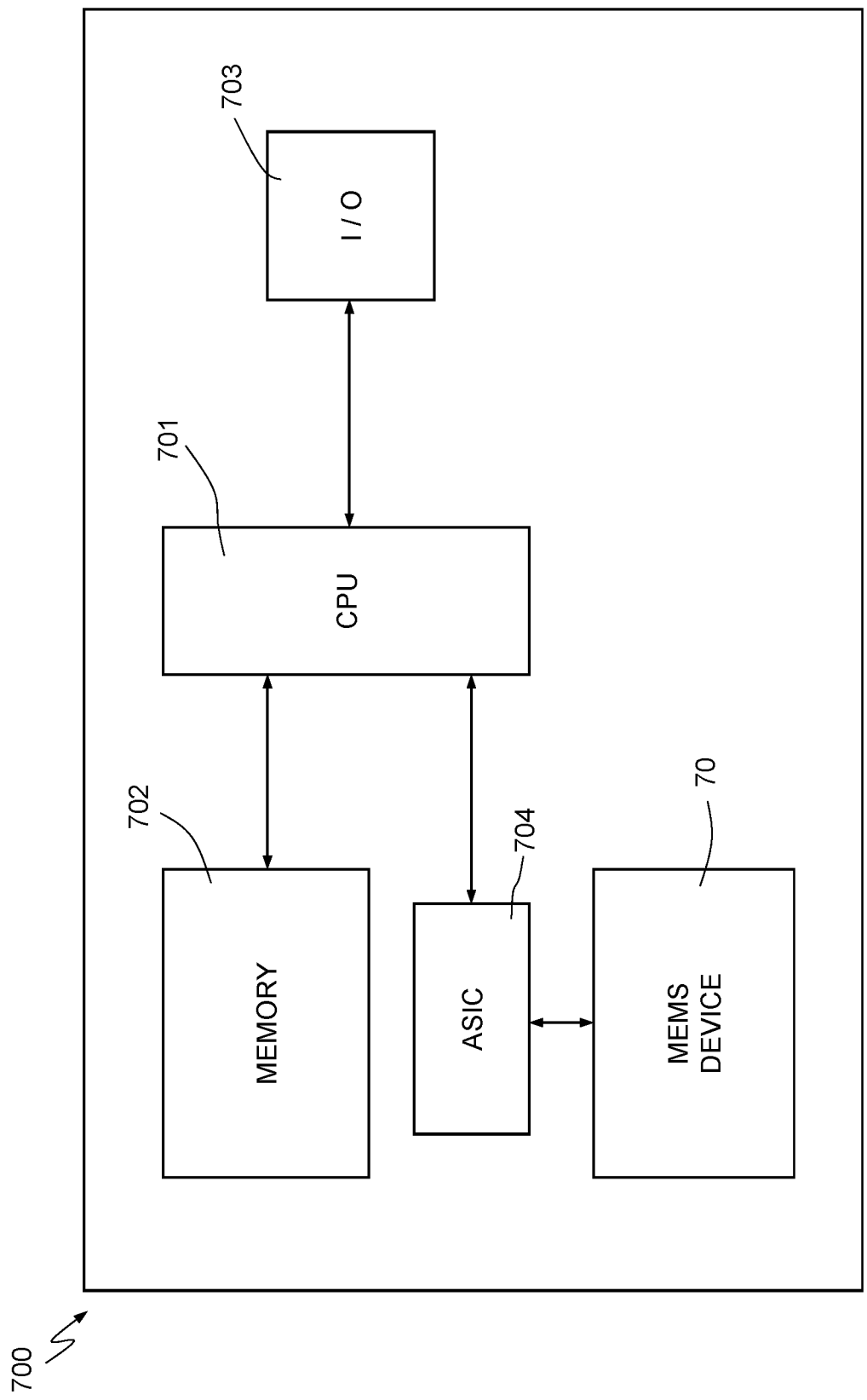

PIEZOELECTRIC MEMS DEVICE HAVING A SUSPENDED DIAPHRAGM AND MANUFACTURING PROCESS THEREOF

BACKGROUND

Technical Field

The present disclosure relates to a piezoelectric MEMS device having a suspended diaphragm and to the manufacturing process thereof.

Description of the Related Art

As is known, actuators are devices that convert a physical quantity of one type into another one of a different type, and the quantity deriving from the conversion usually involves some form of movement or mechanical action.

Recently, actuators have been proposed that have micrometric and nanometric dimensions, also referred to, respectively, as microactuators and nanoactuators, which may be obtained with semiconductor technology, and thus at very contained costs, and are of the so-called MEMS (Micro-Electro-Mechanical Systems) type. They may be used in a wide range of devices, in particular in mobile and portable devices.

Examples of microactuators are valves, switches, pumps, linear and rotary micromotors, linear positioning devices, speakers, optical devices and PMUTs (Piezoelectric Micromachined Ultrasonic Transducers).

Known microactuators basically work according to four physical principles:

electrostatic principle, whereby the attraction between conductors charged in an opposite way is exploited;

thermal principle, whereby the displacement caused by thermal expansion or contraction is exploited;

piezoelectric principle, whereby the displacement caused by the strain and stress induced by electrical fields is exploited; and magnetic principle, whereby the displacement caused by the interaction between different elements presenting magnetic characteristics, such as permanent magnets, external magnetic fields, magnetizable materials, and conductors of electric current, is exploited.

Each technology has advantages and limits as regards to power consumption, rapidity of movement, exerted force, amplitude of movement, movement profile, simplicity of manufacture, amplitude of the applied electrical signals, robustness, and sensitivity, which render advantageous the use thereof in certain applications, but not in others, and thus determine the field of use.

Hereinafter, an actuator device obtained with MEMS technology is considered, which operates according to a piezoelectric principle and in particular is able to exploit TFP (Thin-Film Piezo) MEMS technology.

TFP MEMS technology currently uses a monomorphic mode of actuation, wherein a structure (e.g., a diaphragm, a beam, or a cantilever), generally formed by at least two layers arranged on top of one another, is bent as a result of variations in the applied stress. In this case, there is a controlled alteration of the strain in one of the layers, referred to as active layer, which causes a passive strain in the other layer or layers, also referred to as inactive or passive layer or layers, with a consequent deflection of the structure.

This technique is advantageously used for bending the diaphragm, beam, or cantilever in applications wherein a vertical movement, i.e., in a direction perpendicular to the plane of lie of the structure, is desired, such as in liquid-jet printheads, self-focusing systems, micro-pumps, micro-switches, speakers, and PMUTs.

For instance, FIGS. 1A and 1B show a cantilever beam 1 constrained at a first end 2 and free to bend at a second end 3. The beam 1 is here formed by a stack of layers that include a supporting layer 4, for example, of a semiconductor material (e.g., silicon); an insulating layer 5, for example, of silicon oxide ($SiO_2$); a first electrode layer 6, of metal (e.g., platinum); a piezoelectric material layer 7, for example, of PZT (Pb, Zr, $TiO_2$); a second electrode layer 8, of metal (e.g., platinum, ruthenium, iridium oxide, or an alloy of titanium and tungsten); and a passivation layer 9, for example, of silicon oxide.

In the presence of a reverse bias, as illustrated in FIG. 1B, the applied electrical field causes strains in the beam 1 that give rise to a deflection of the free end 3 upwards.

An embodiment of a MEMS piezoelectric actuator applied to a generic optical device is illustrated in FIGS. 2A and 2B. In these figures, the optical device, designated by 10, comprises a deformable part or diaphragm 15, for example of glass, resting, through a lens element 11 (made, for example, of polymeric material), on a support 12, which is, for example, also of glass; the diaphragm 15 further carries two piezoelectric regions 13, arranged a at a distance from each other. In the absence of a bias (FIG. 2A), the diaphragm 15 and the lens element 11 have a planar surface and do not modify the path of a light beam 16 that traverses them. When the piezoelectric regions 13 are biased, they cause a deformation of the diaphragm 15. The deformation of the central area of the diaphragm 15 is transmitted to the lens element 11, the top surface whereof curves, modifying the focus of the lens element 11 and thus the path of the light beam 16 (FIG. 2B). It is thus possible to modify the characteristics of optical transmission of the optical device 10.

The piezoelectric actuators illustrated in FIGS. 1A, 1B, 2A, and 2B has the advantage of being fast and compact devices; in fact, unlike other types of actuators, such as capacitive and/or magnetic actuators, they do not require further structures, such as electrodes connected to a reference potential (as in the case of capacitive actuators) or magnets and/or coils (as in the case of magnetic actuators).

Another embodiment of piezoelectric-actuation MEMS device is illustrated in FIG. 3 and designated hereinafter by 30. In particular, the MEMS device 30 of FIG. 3 has a quadrangular shape (e.g., square) in top plan view, with a side having a length D and its center O lying on a central axis C parallel to a first axis Z of a Cartesian reference system XYZ.

The MEMS device 30 comprises a substrate 32, of semiconductor material (e.g., silicon), having a first surface 32A and a second surface 32B. The substrate 32 has a cavity 34 extending from the second surface 32B.

In detail, the cavity 34 is laterally delimited by a wall and at the top by a bottom surface 32C. The substrate portion 32 delimited between the bottom surface 32C of the cavity 34 and the first surface 32A of the substrate 32 forms a diaphragm 37, and is thus monolithic with the substrate 32. The cavity 34 generally has, in top plan view, a quadrangular shape (e.g., square) and has an extension, along a second axis X of the Cartesian reference system XYZ, of a length L. The length L is further smaller than the diameter D of the device.

An insulating layer 39, for example, of silicon oxide ($SiO_2$), extends over the first surface 32A of the substrate 32, and a structural layer 41, for example, of polysilicon, oxide, or some other material, extends over the insulating layer 39.

Extending on the structural layer 41, all along the periphery of the MEMS device 30, is a piezoelectric actuator 50, which is annulus-shaped in plan view and is formed by a stack of layers. In particular, the stack of layers comprises a first electrode 60; a layer of piezoelectric material 61, for example of PZT (Pb, Zr, $TiO_2$), which extends over the first electrode 61; a second electrode 62, which extends over the layer of piezoelectric material 61; and a passivation layer 63, which extends over the second electrode 62 and over the exposed surface of the structural layer 41. A contact electrode 64, of metal material (such as gold, aluminium, or copper) and, for example, annulus-shaped, extends on the passivation layer 63 and is vertically aligned to the piezoelectric actuator 50; further, the contact electrode 64 is electrically connected to the second electrode 62 by a contact trench 64A, which extends at least in part through the passivation layer 63.

Alternatively, the MEMS device 30 may not have the contact electrode 64 and have, on top and/or within the structural layer 41, electrical interconnections for biasing the piezoelectric actuator 50.

In use, a potential difference is applied between the first and second electrodes 60, 62 of the piezoelectric actuator 50 to generate a deflection of the diaphragm 37 in an upward direction (i.e., along the first axis Z, away from the cavity 34) in a unidirectional way.

The piezoelectrically actuated devices illustrated in FIGS. 1A, 1B, 2A, 2B and 3 do not effectively block deformation of the mobile structures, here the diaphragm 37, in the presence of impact and mechanical stresses.

Further, for MEMS actuators, as the MEMS device 30 illustrated in FIG. 3, optimization of the shapes may be limited. In fact, with the current processes, the diaphragm 37 is defined using an etching process for formation of the cavity 34, which determines the shape thereof. On the other hand, the optimal shape of the diaphragm 37 is dictated by its function, i.e., by the structures moved by the diaphragm 37 during actuation (e.g., mechanical transmission elements in pumps or speakers). It follows that it is difficult to reach a compromise between the functional specification and the manufacturing processes currently used.

BRIEF SUMMARY

Embodiments are directed to a MEMS device having a suspended diaphragm and a manufacturing process. In one or more embodiment, the MEMS device and the manufacturing process may overcome one or more the drawbacks of the prior art.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIGS. 5-11 are cross-sections of the MEMS device of FIG. 4 in successive manufacturing steps;

FIG. 17 is a block diagram of an electronic apparatus including the MEMS device of FIG. 16.

DETAILED DESCRIPTION

Figure 1A:
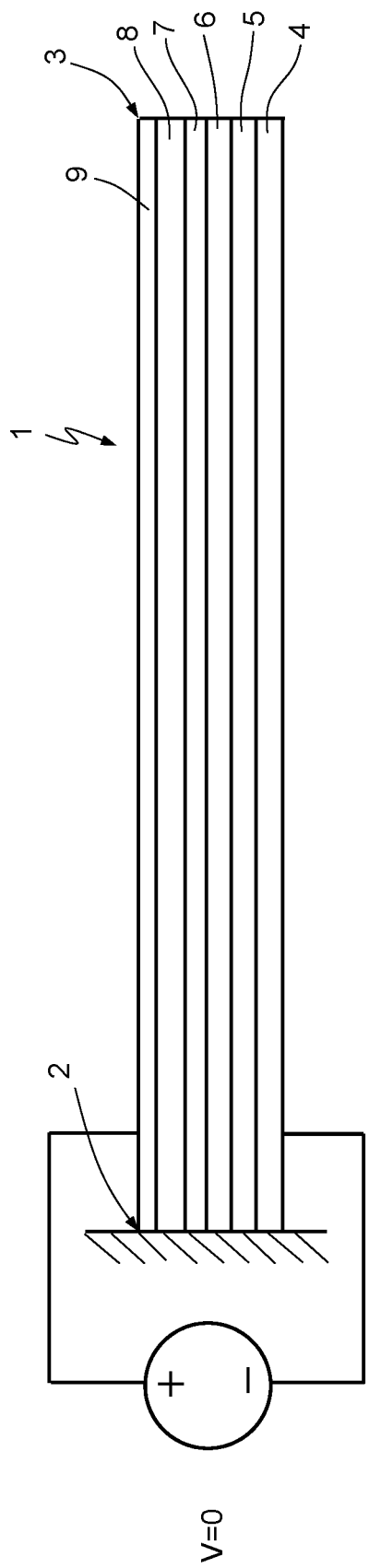
FIGS. 1A and 1B show simplified lateral views of a known piezoelectrically actuated MEMS actuator in a rest condition and a deformed condition, respectively.
Figure 1B:
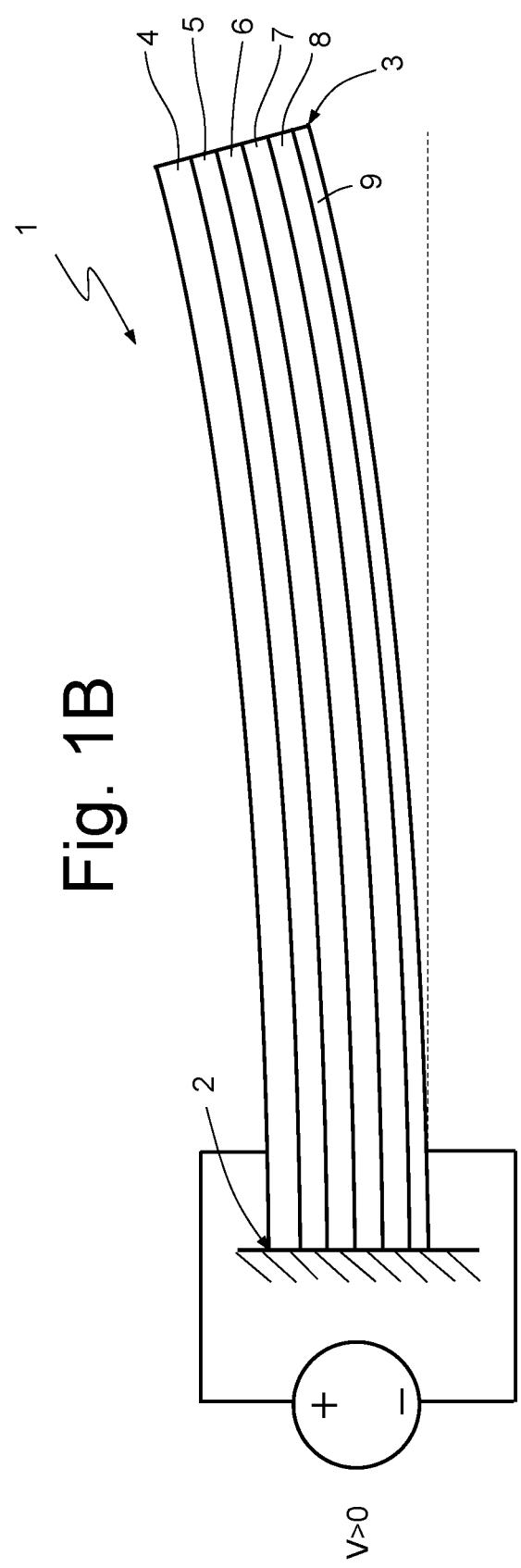
Figure 2A:
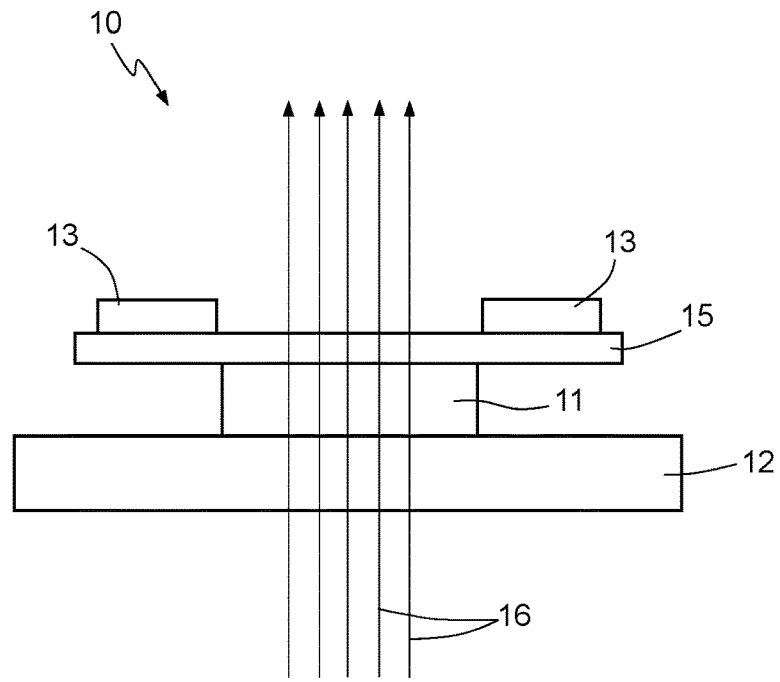
FIGS. 2A and 2B show simplified lateral views of another known piezoelectrically actuated MEMS actuator, used in an optical device in a rest condition and a deformed condition, respectively.
Figure 2B:
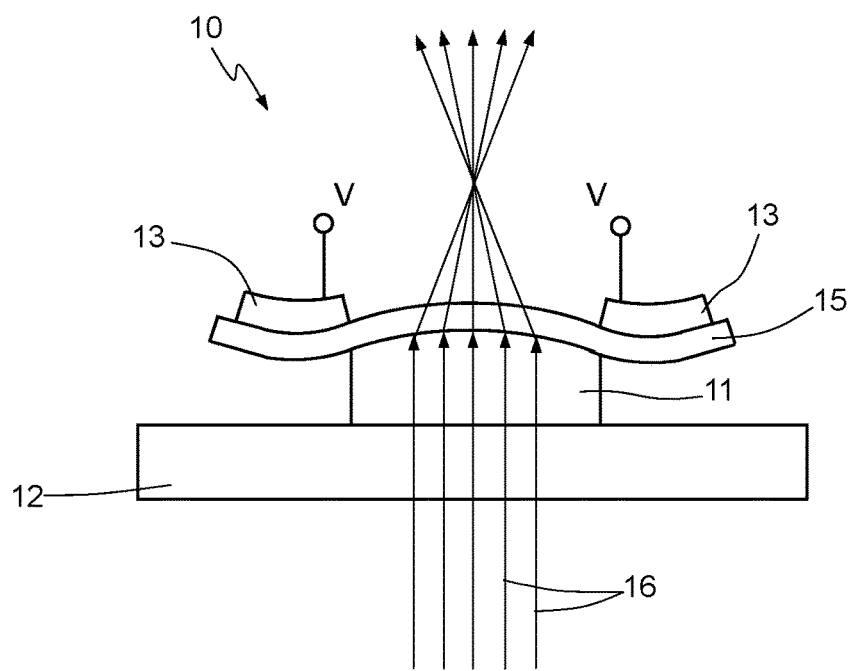
Figure 3:
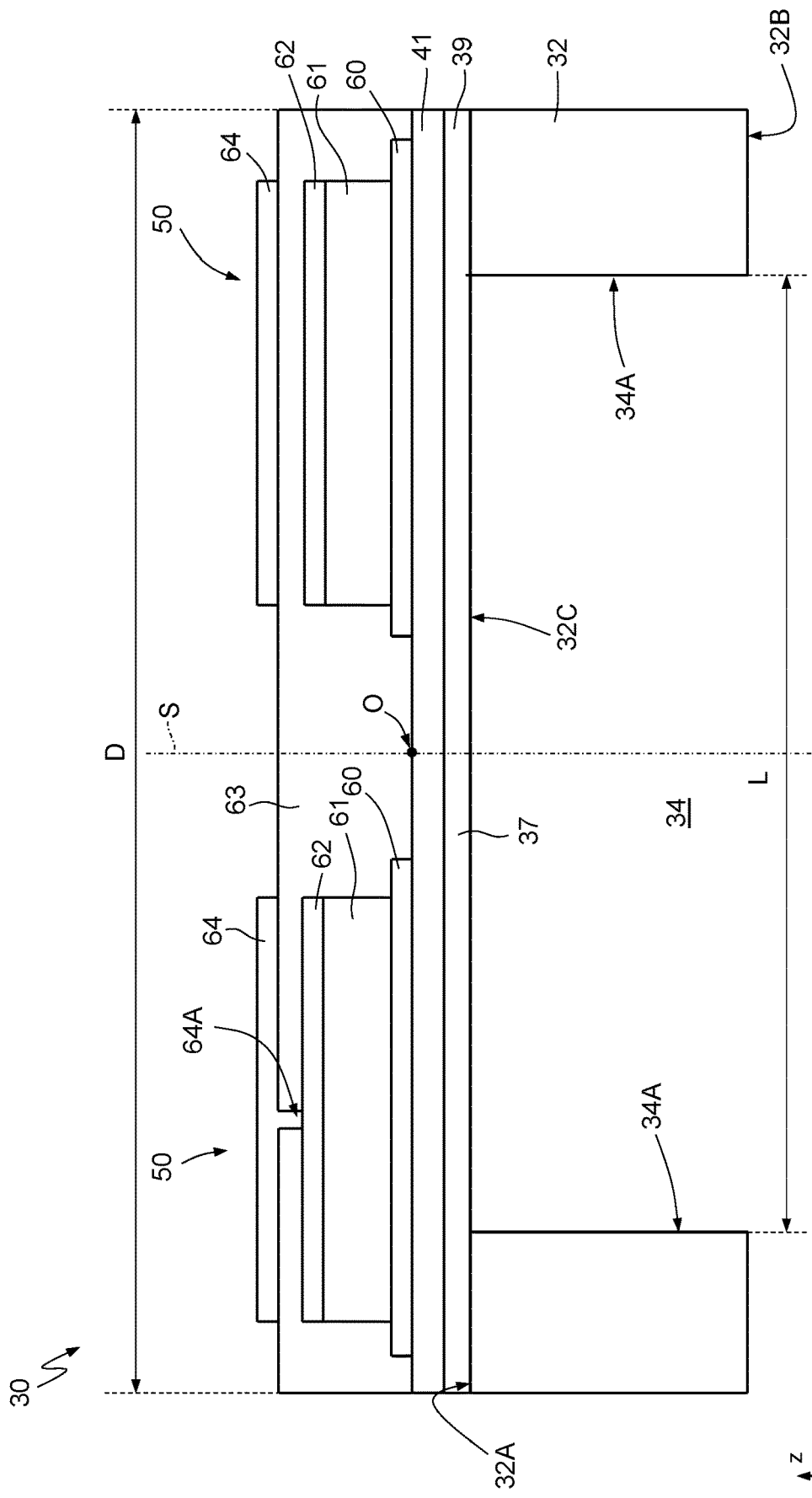
FIG. 3 is a simplified cross-sectional view of a known piezoelectrically actuated MEMS actuator.
Figure 4:
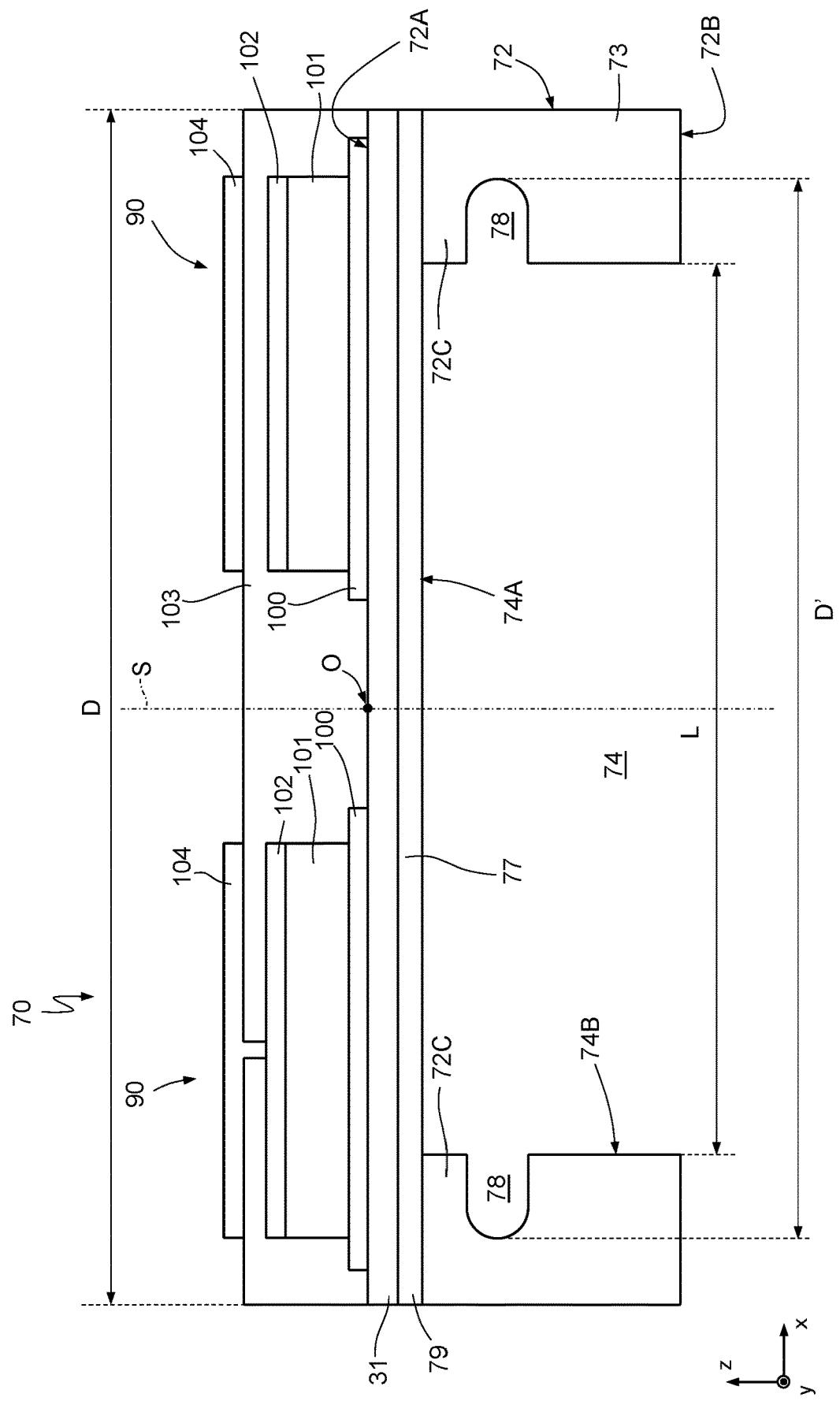
FIG. 4 is a cross-sectional view of the present MEMS device according to an embodiment.
Figure 16A:
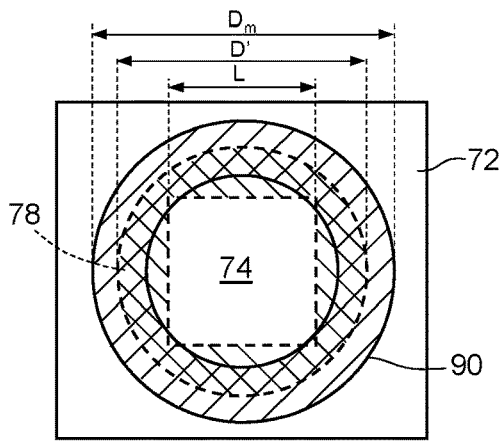
FIGS. 16A-16F are top plan views, with parts in ghost view and portions removed, of different embodiments of the present MEMS device.

FIGS. 4 and 16A show an embodiment of a piezoelectrically actuated MEMS device 70; in particular, without this implying any loss of generality, the MEMS device 70 is an actuator for mechanical applications, such as valves and pistons, or for optical applications.

The MEMS device 70 of FIGS. 4 and 16A has a parallelepipedal shape, with a length D, in a direction parallel to a first axis X of a Cartesian reference system XYZ, and comprises a piezoelectric actuator 90, having the shape, for example, of an annulus with center O lying on a central axis C parallel to a second axis Z of the Cartesian reference system XYZ.

The MEMS device 70 comprises a body 72, having a first surface 72A and a second surface 72B. The body 72 comprises a substrate 73, of semiconductor material, such as silicon; an insulating layer 79, for example, of silicon oxide ($SiO_2$), extending over the substrate 73; and a structural layer 81, for example, of polysilicon, oxide, or other material compatible with semiconductor technology.

The substrate 73 has a diaphragm cavity 74 extending from the second surface 72B and through the substrate 73 in the direction of the thickness of the substrate 73; the diaphragm cavity 74 is closed at the top by the insulating layer 79, which forms a bottom surface 74A of the diaphragm cavity 74.

The diaphragm cavity 74 is laterally delimited by a wall 74B and has a quadrangular shape in bottom plan view. In particular, in FIG. 4, the diaphragm cavity 74 has a base with a square shape with side of length L (see also FIG. 16A).

A recess 78 of an annular shape laterally extends in the body 72 from the diaphragm cavity 74, at a short distance from the insulating layer 79. In a bottom plan view, the recess 78 here is ring-shaped with maximum diameter D', greater than the length L, and is concentric to the diaphragm cavity 74. A portion 72C of the body 72 of semiconductor material is located above the recess 78.

The structural layer 81 is delimited at the top by the first surface 72A of the body 72 and forms, at the bottom surface 72A of the diaphragm cavity 72, a deformable portion 77. The portion 72C of the body 72 of semiconductor material located above the recess 78 is able to flex when high deformations of the deformable portion 77 occur.

The piezoelectric actuator 90 extends on the first surface 72A of the body 72 and comprises a first electrode 100; a piezoelectric region 101, for example, of PZT (Pb, Zr, $TiO_2$), which extends over the first electrode 101; and a second electrode 102, which extends over the piezoelectric region 101.

A passivation layer 103, for example, of silicon oxide or silicon nitride ($Si_3N_4$), extends over the second electrode 102 and on the first surface 72A, where the latter is exposed, entirely coating the piezoelectric actuator 90 and the structural layer 81. A contact region 104, for example of metal (such as gold or aluminium), extends on the passivation layer 103 and is electrically coupled to a bias and control electronics (not illustrated). In particular, the contact region 104 is arranged to be vertically aligned to the piezoelectric actuator 90. Further, the contact region 104 is electrically coupled to the second electrode 102 by a contact trench 104A dug in the passivation layer 103.

Alternatively, the MEMS device 70 may not have a contact region 104 but, on and/or within the structural layer 81, electrical interconnections (not illustrated) for biasing the piezoelectric actuator 90.

In use, a potential difference is applied between the first and second electrodes 100, 102 of the piezoelectric actuator 90 to generate a deflection of the deformable portion 77 in a direction parallel to the first axis Z, in a per se known manner. This deflection enables the MEMS device 70 to operate according to the desired technical effect.

This deflection enables, for example, opening or closing (in the case of its application as a valve) or executing a vertical movement (in applications such as pistons or speakers).

FIGS. 5-11 illustrate successive manufacturing steps of the MEMS device 70 of FIG. 4, according to a first embodiment.

Figure 5:
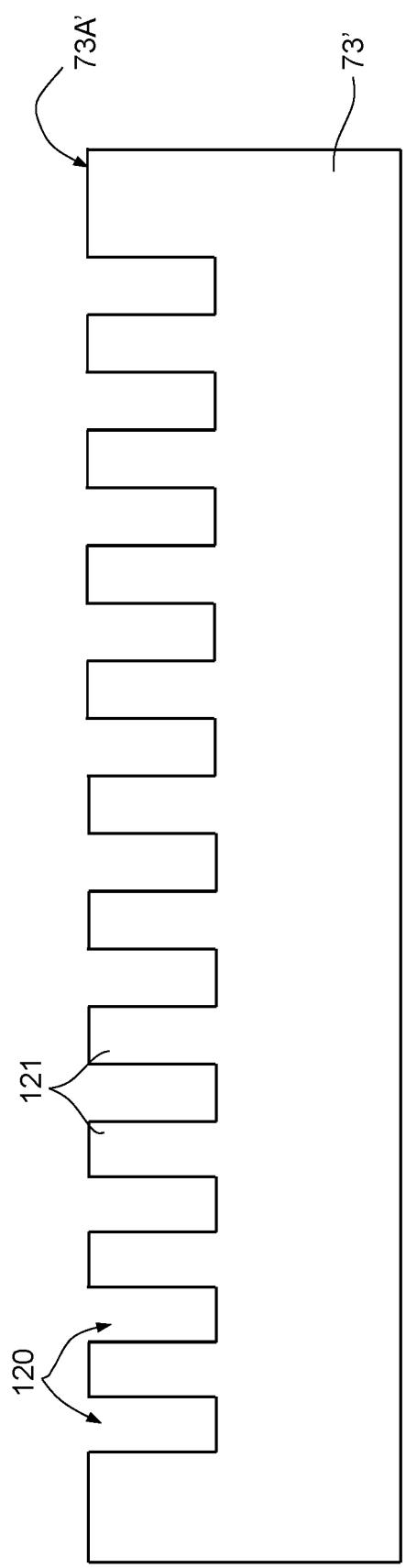

Initially, FIG. 5, in a wafer 73' of monocrystalline semiconductor material such as silicon, a buried cavity, intended to form the recess 78, is formed. For instance, for this purpose, the manufacturing process described in the European patent EP 1577656 (corresponding to the U.S. Pat. No. 8,173,513) and summarized below may be used.

In detail, FIG. 5, using a resist mask (not illustrated) having honeycomb-lattice openings, an anisotropic chemical etch is carried out on a first top surface 73A' of the wafer 73' so as to form a plurality of trenches 120, which communicate with one another and delimit a plurality of columns 121 of silicon. In particular, the plurality of trenches 120 is formed in an area of the substrate 73 where the recess 78 is to be formed.

After removing the mask (not illustrated), an epitaxial growth is carried out in a reducing environment. Consequently, an epitaxial layer grows on the first top surface 73A' of the wafer 73', closing the trenches 120 at the top.

A thermal annealing step is then carried out, for example for 30 minutes at 1190° C., preferably in a hydrogen, or, alternatively, nitrogen atmosphere. As discussed in the patents referred to above, the annealing step causes a migration of the silicon atoms, which tend to move into a position of lower energy. Consequently (FIG. 6), and also by virtue of the short distance between the columns 121, the silicon atoms of the latter migrate completely, and a buried cavity 76 is formed. A thin silicon layer, for example having a thickness comprised between 5 µm and 10 µm (e.g., 6 µm), remains on top of the buried cavity 76 and is formed in part by epitaxially grown silicon atoms and in part by migrated silicon atoms. A wafer 73" is thus obtained, having a second top surface 73A" and a bottom surface, the latter corresponding to the second surface 72B of the body 72 and thus being designated by the same reference number.

With reference to FIG. 7, the insulating layer 79 is deposited on the second top surface 73A" of the wafer 73", according to known techniques. For instance, the insulating layer 79 has a thickness comprised between 0.5 µm and 1.5 µm.

With reference to FIG. 8, the structural layer 81, of polycrystalline silicon or of an optically transparent material, is deposited on the insulating layer 79. In particular, the structural layer 81 has a thickness, for example, comprised between 3 µm and 25 µm and has a top surface, which corresponds to the first surface 72A of the body 72 and is thus designated by the same reference number in FIG. 8.

Figure 9:
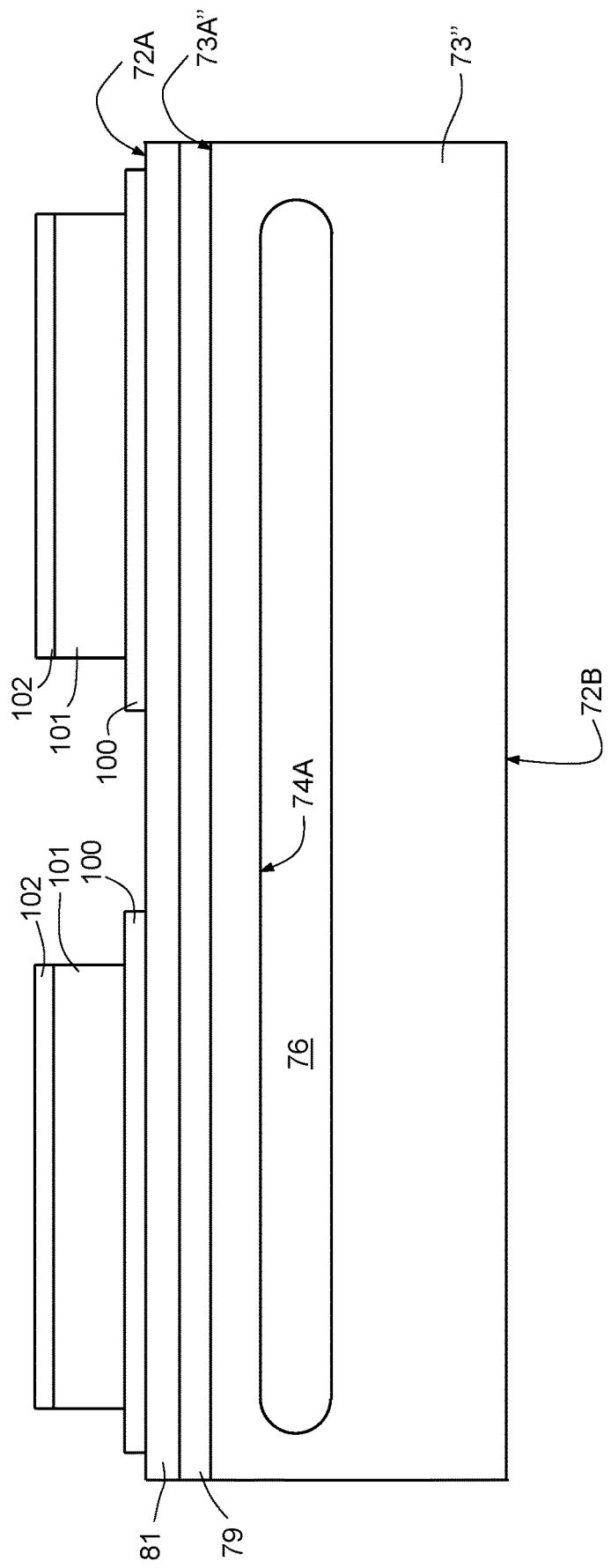

With reference to FIG. 9, the first electrode 100 is formed on the first surface 72A of the body 72 using known deposition and masking techniques. Then, a piezoelectric layer and an electrode layer are deposited in succession and defined using known masking and definition techniques so as to form the piezoelectric region 101 and the second electrode 102.

Figure 10:
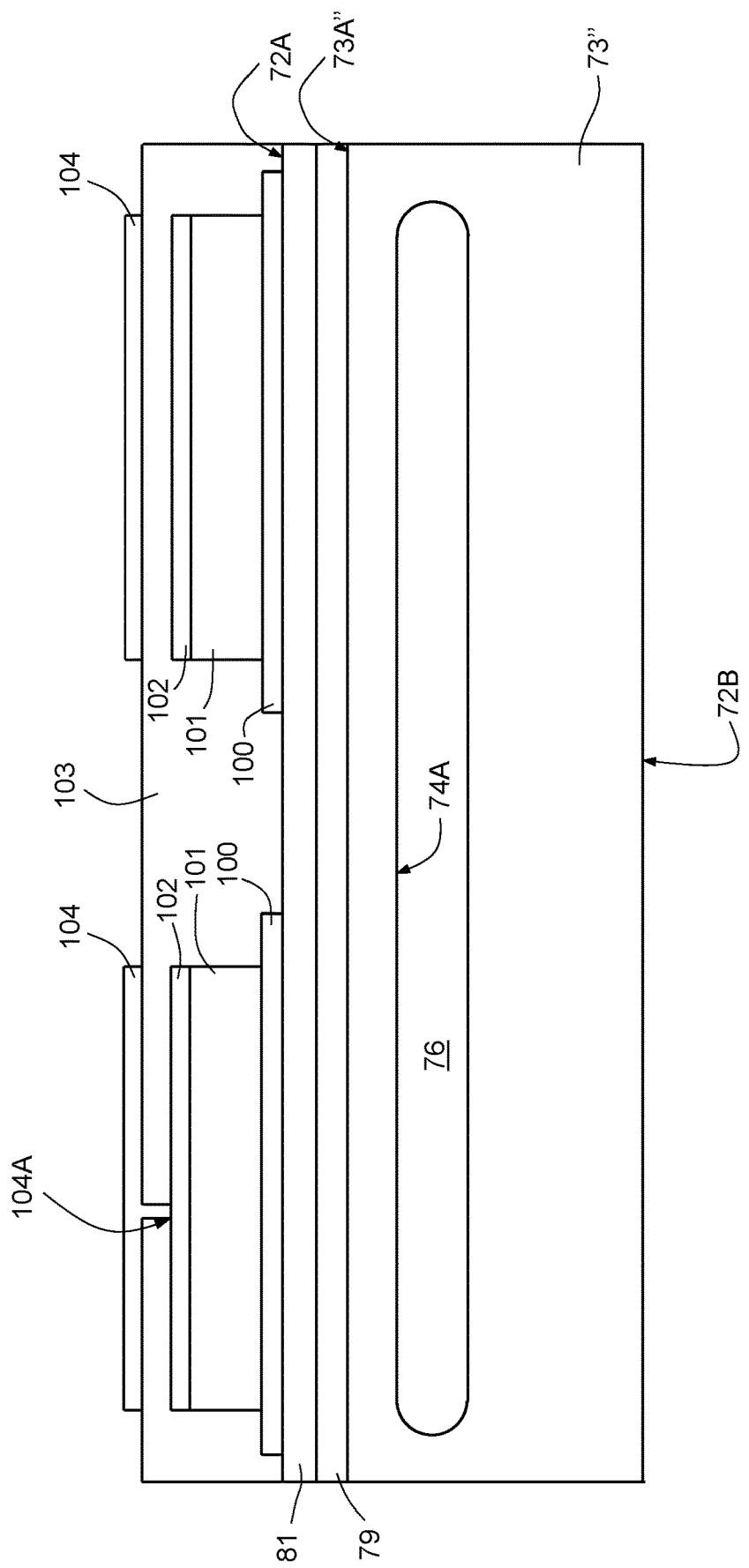

With reference to FIG. 10, the passivation layer 103 is deposited on the second electrode 102 and on the first surface 72A, coating the structural layer 81 and the piezoelectric actuator 90 completely. Then, the contact region 104 is formed on the passivation layer 103, which has previously been etched to form the via 104A.

Figure 11:
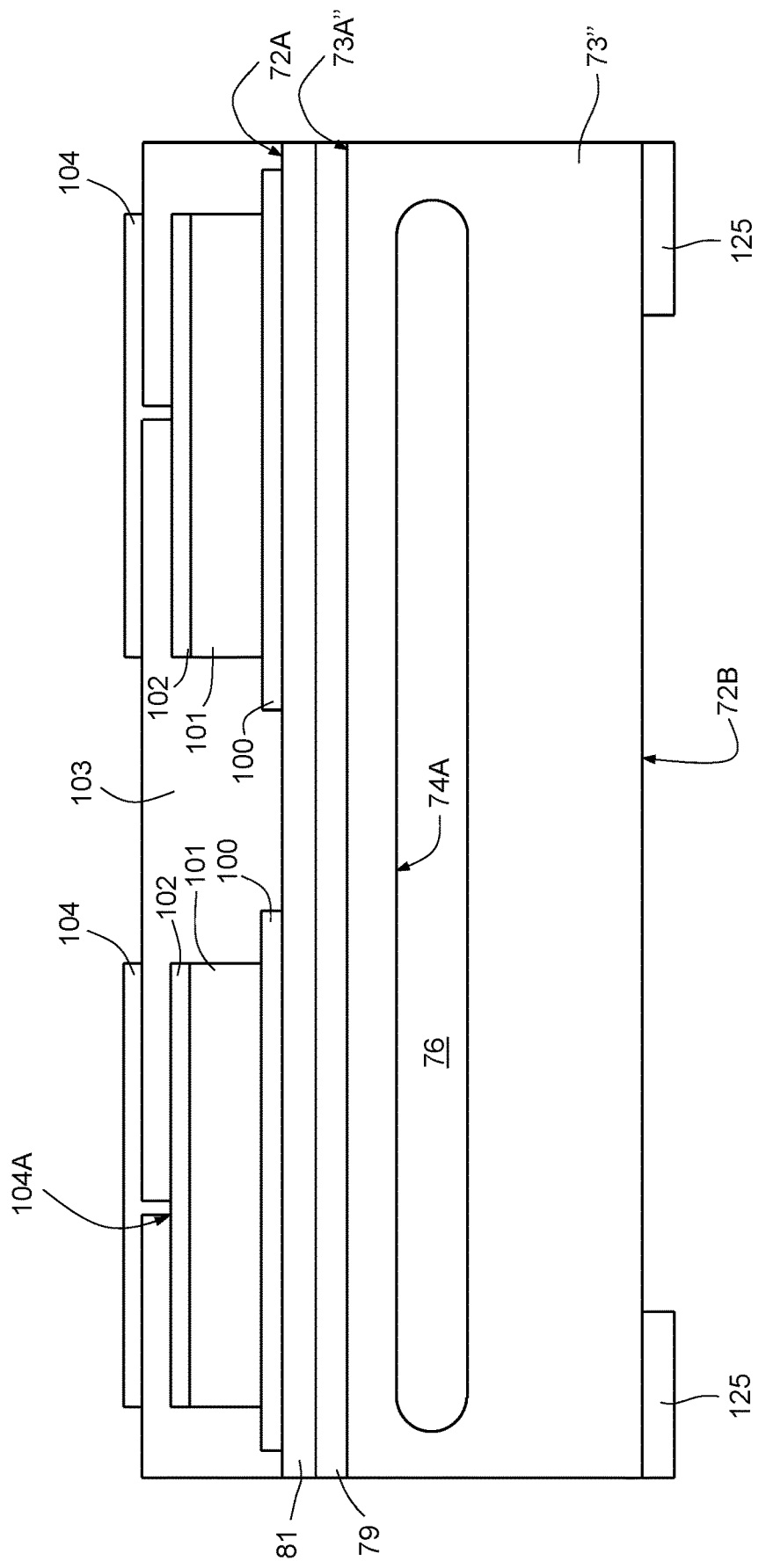

In FIG. 11, a mask layer 125 is deposited and patterned on the second surface 72B of the wafer 73", which is etched from the back using known photolithographic and etching techniques (e.g., anisotropic chemical etching such as DRIE—Deep Reactive Ion Etching), so as to form the diaphragm cavity 74. In particular, the etching step is carried out until the buried cavity 76 is reached, as far as the insulating layer 79, and so that the diaphragm cavity 74 is concentric to the buried cavity 76. In practice, the diaphragm cavity 74 passes right through the wafer 73" and incorporates most of the buried cavity 76 to release the deformable portion 77; at the end, of the buried cavity 76 only the recess 78 remains to be separately visible.

At the end of the process, the mask layer 125 is removed, the wafer 73" is diced, and the MEMS device 70 of FIG. 4 is thus obtained.

Figure 12:
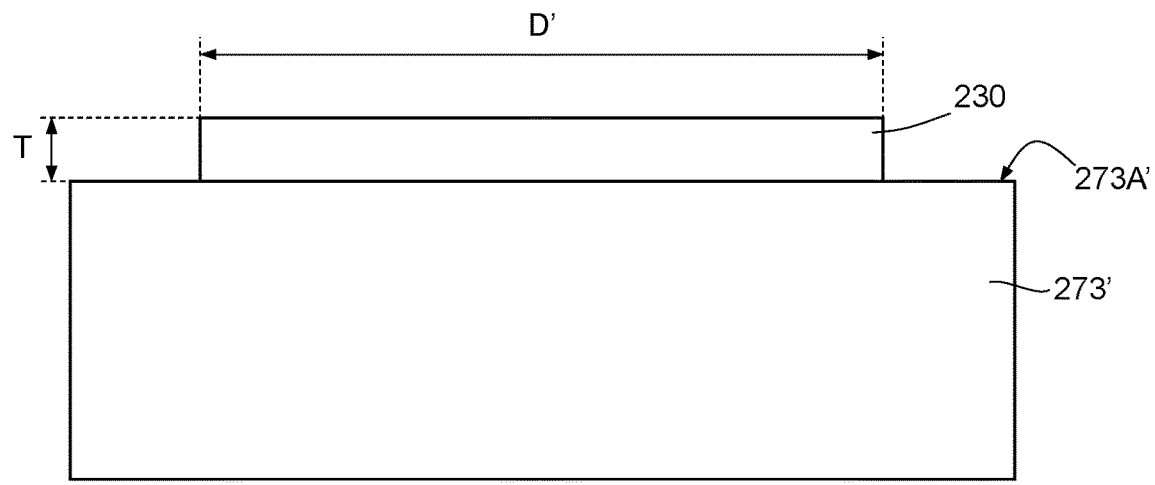
FIGS. 12 and 13 are cross-sections of the MEMS device of FIG. 4 in successive manufacturing steps of the buried cavity according to a variant of the manufacturing process.
Figure 13:
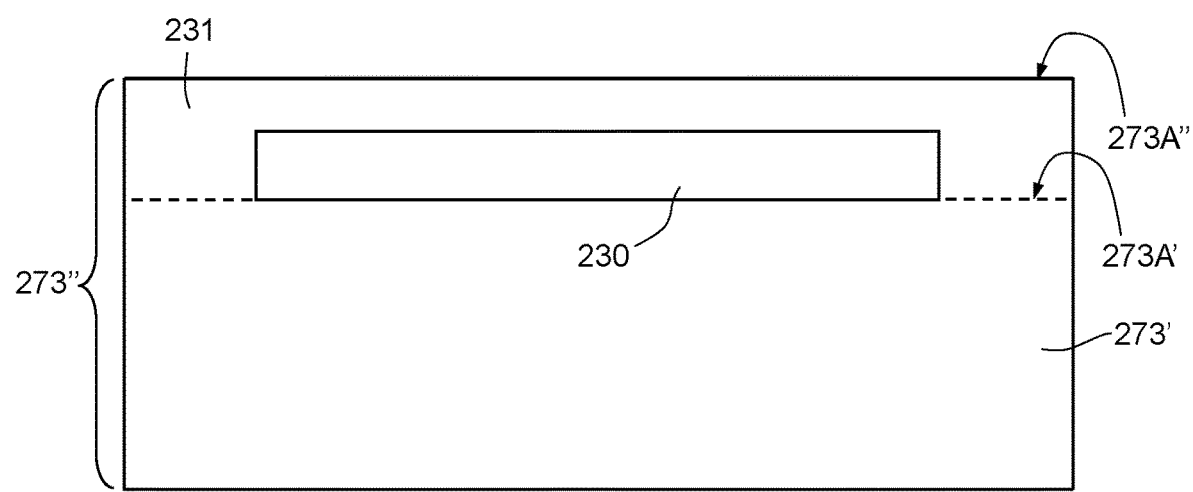

The buried cavity 76 of the wafer 73" may also be formed in a different way. For instance, FIGS. 12-13 show a solution wherein the buried cavity 76 is obtained by removing a sacrificial layer. In these figures, elements in common with FIGS. 5-11 are designated by the same reference numbers increased by 200.

Figure 6:
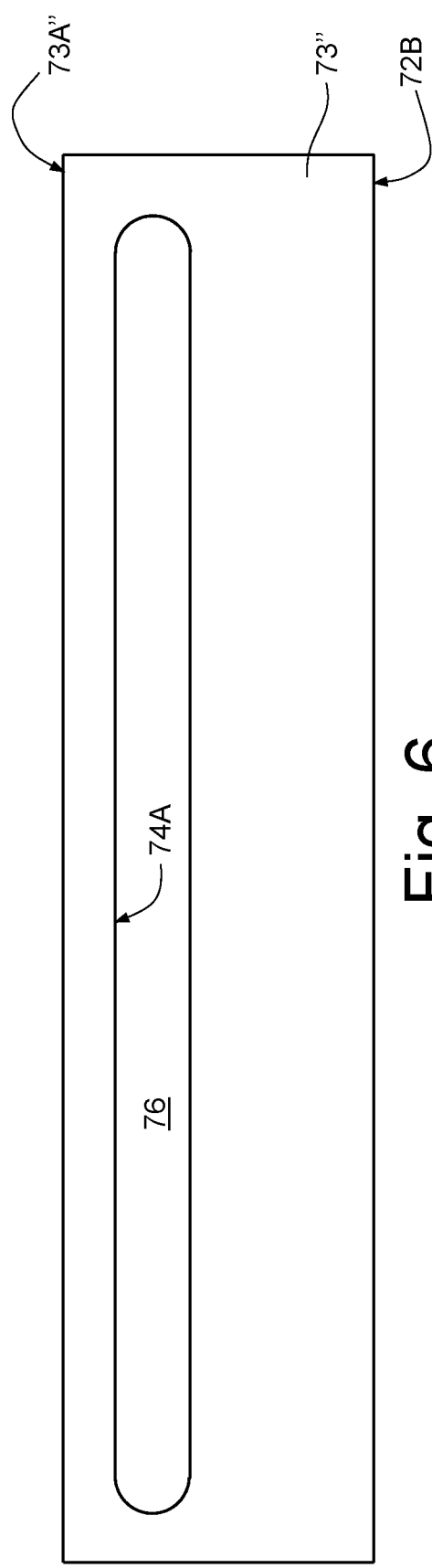

In FIG. 12, a sacrificial layer, for example, of silicon oxide, is deposited on the top surface 273A' of the wafer 273' and is then patterned so as to form a sacrificial region 230 having a shape complementary to the buried cavity 76 of FIG. 6. In particular, the sacrificial region 230 has a cylindrical shape of diameter D' and a thickness T (defined in a direction parallel to the second axis Z).

With reference to FIG. 13, a covering layer, here designated by the reference number 231, for example, of polysilicon, is grown on the sacrificial layer 230 according to growth techniques per se known, to obtain the wafer 273".

The further manufacturing steps are similar to the ones described in FIGS. 7-11. In particular, here two etches are carried out, initially comprising etching the wafer 273" to form a first portion of the diaphragm cavity 74 of FIG. 4 and then etching the sacrificial layer 230, which is removed so as to obtain the inner cavity 76 of FIG. 6. Then, an etch is carried out on the covering layer 231 so as to release completely the deformable portion 77 and thus obtain the MEMS device 70 of FIG. 4.

Figure 14:
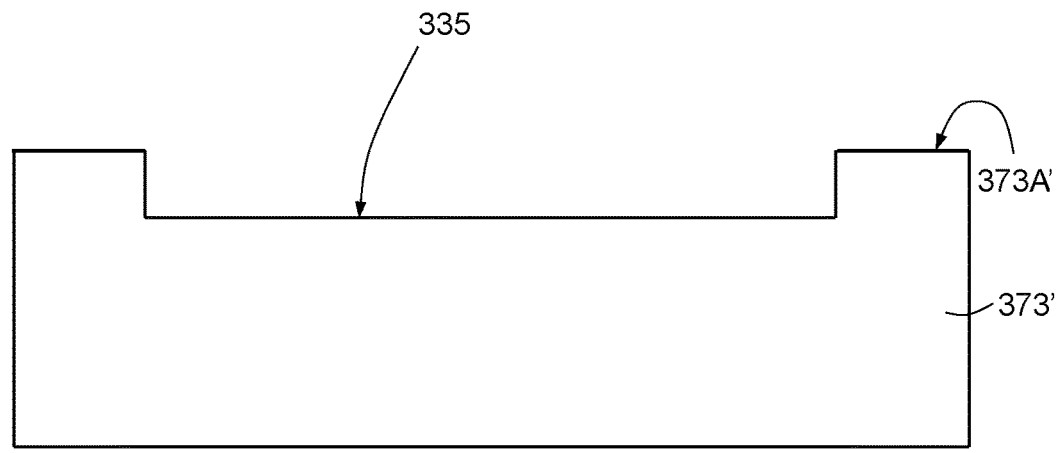
FIGS. 14 and 15 are cross-sections of the MEMS device of FIG. 4 in successive manufacturing steps of the buried cavity, according to another variant of the manufacturing process.
Figure 15:
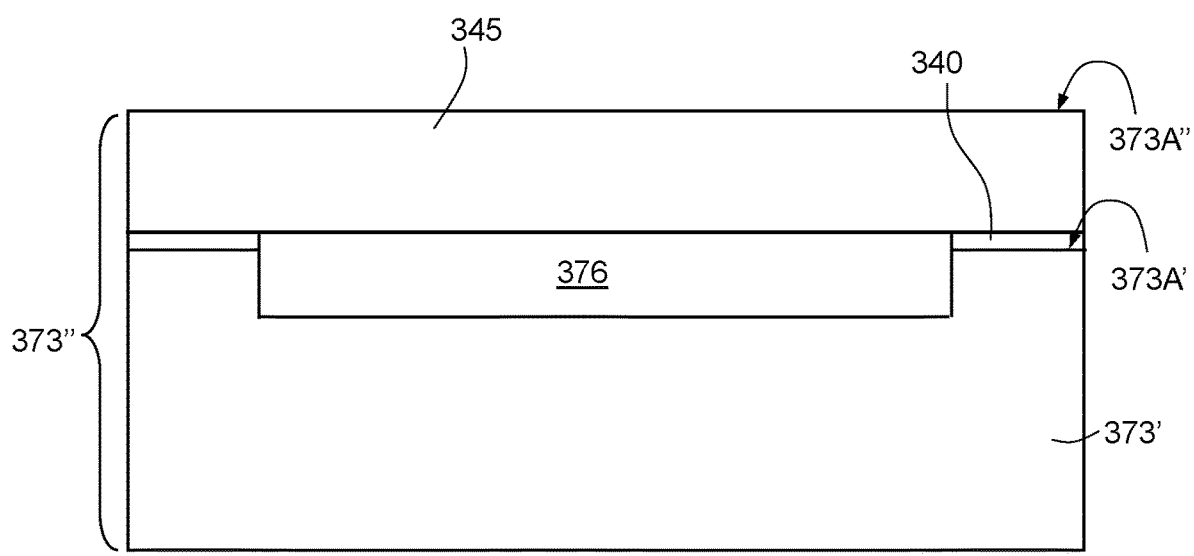

FIGS. 14-15 show a further solution for forming the buried cavity 76 of FIG. 6, here designated by the reference number 378. In particular, elements that are in common with the ones described with reference to FIGS. 5-11 are designated in FIGS. 14-15 by the same reference numbers increased by 300.

In detail, FIG. 14, a first wafer 373' is selectively etched, by masking and etching techniques per se known, from its top surface 373A' so as to obtain a groove 335 having a circular shape in top plan view and dimensions substantially equal to those of the buried cavity 76 of FIG. 6.

With reference to FIG. 15, a covering wafer 345 is bonded to the first wafer 373' by a bonding layer 340 (for example, of oxide, polymer, or metal). The covering wafer 345 thus closes the groove 335 at the top to form a buried cavity 376 corresponding to the buried cavity 76 of FIG. 6.

Manufacturing steps similar to the ones described with reference to FIGS. 6-11 then follow.

FIGS. 16A-16F show different shapes of the recess 78 and/or of the actuator 90 of the MEMS device 70 of FIG. 4, irrespective of whether the recess 78 is obtained according to FIGS. 5-6 or FIGS. 12-16. In particular, in FIGS. 16A-16F, for a clearer understanding, the passivation layer 103 and the contact electrodes 104 of FIG. 4 have been removed.

In the top plan view of FIG. 16A (as already mentioned), the piezoelectric actuator 90 is annulus-shaped, the recess 78 is ring-shaped, and the diaphragm cavity 74 is square-shaped. The recess 78 and the diaphragm cavity 74 are concentric to each other. Further, the recess 78 has a diameter D' smaller than the outer diameter, here designated by $D_m$, of the piezoelectric actuator 90 and approximately equal to the diagonal of the diaphragm cavity 74.

Figure 16B:
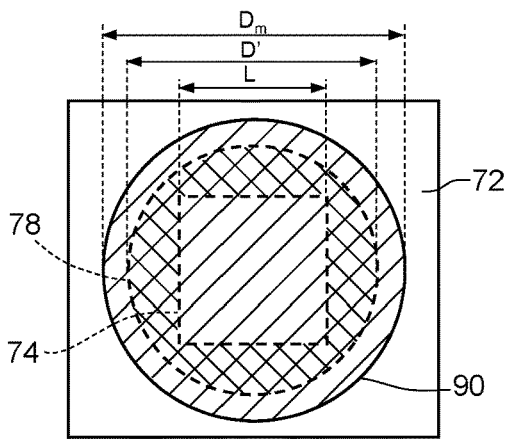

In FIG. 16B, the piezoelectric actuator 90 has a full circular shape, the recess 78 also has a circular shape, and the diaphragm cavity 74 has a square shape. As may be noted in the top plan view of FIG. 16B, the piezoelectric actuator 90 has an area larger than the diaphragm cavity 74 and completely surrounds it. This embodiment may be advantageously used in devices that, in use, perform vertical movements (i.e., along the first axis Z), such as pistons, switches, or speakers.

Figure 16C:
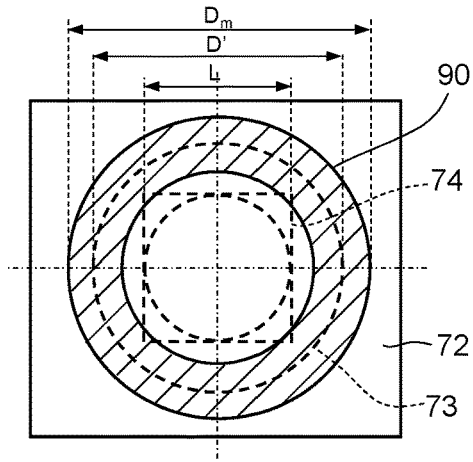

In FIG. 16C, the piezoelectric actuator 90 is annulus-shaped in top plan view; further, the recess 78 here is annulus shaped (obtained from a ring-shaped buried cavity 76), and the diaphragm cavity 74 is square-shaped. In particular, the recess 78 has an outer diameter D' smaller than the outer diameter $D_m$ of the piezoelectric actuator 90 and an inner diameter approximately equal to the side L of the diaphragm cavity 74. As in FIG. 16A, the piezoelectric actuator 90 exposes the central area of the underlying body 72 so that, in use, the device may be used for applications such as a piston.

Figure 16D:
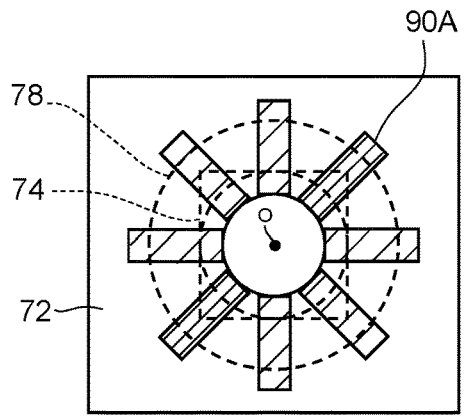

In FIG. 16D, the recess 78 has the shape of an annulus in top plan view (obtained from a buried cavity 76 of an annular shape), the diaphragm cavity 74 has a square shape, and the piezoelectric actuator 90 is formed by a plurality of actuator elements 90A (eight in FIG. 16D), having the same layered structure as the piezoelectric actuator 90 of FIG. 4 respectively. In detail, each actuator element 90A has a quadrangular shape (e.g., rectangular) in top plan view; the actuator elements 90A are arranged radially and at a uniform angular distance from the center O. For instance, in the embodiment considered, each actuator element 90A is arranged at 45° from the adjacent actuator elements 90A. This embodiment may, for example, be advantageously used for applications in which the device 70 performs movements both horizontally and vertically, for example, for compensating possible contact problems (e.g., in pistons) or of closing (e.g., in valves).

Figure 16E:
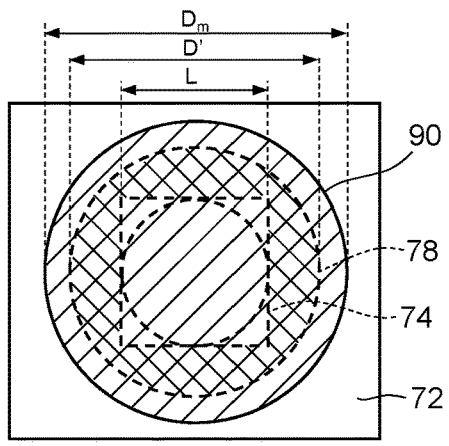

In FIG. 16E, in top plan view, the recess 78 has the shape of an annulus (obtained from a buried cavity 76 of an annular shape), and the piezoelectric actuator 90 has a full circular shape; the diaphragm cavity 74 has a square shape. In particular, the recess 78 has an outer diameter D' smaller than the outer diameter D. of the piezoelectric actuator 90 and an inner diameter approximately equal to the side L of the diaphragm cavity 74. In this way, the piezoelectric actuator 90 extends completely over the diaphragm cavity 74. The embodiment of FIG. 16E is used in the case where the MEMS device 70 is specified, for example, to perform vertical movements (i.e., along the first axis Z) in applications such as valves or pistons.

Figure 16F:
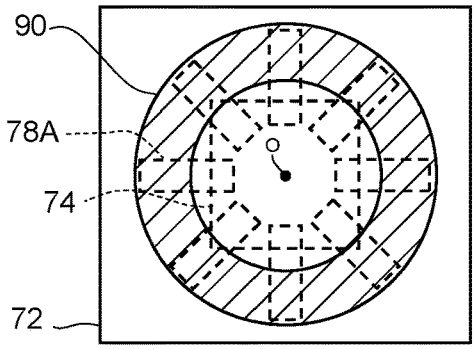

In FIG. 16F, the piezoelectric actuator 90 has the shape of an annulus in top plan view. The diaphragm cavity 74 is formed by a plurality of cavity parts 78A (eight in FIG. 16F) arranged at a same distance from the center O. In detail, each cavity part 78A has a quadrangular shape (e.g., rectangular) in top plan view and is arranged radially and at a uniform angular distance from the adjacent cavity parts 78A. For instance, in the embodiment of FIG. 16F, each cavity part 78A is arranged at 45° from the adjacent cavity parts 78A. This embodiment thus has lateral recesses, which may be used, for example, as stoppers.

FIG. 17 shows an electronic device 700 that uses, for example, the MEMS device 70 of FIG. 4.

The electronic device 700 comprises, in addition to the MEMS device 70, a microprocessor (CPU) 701, a memory block 702, connected to the microprocessor 701, and an input/output interface 703, for example a keypad and/or a display, which is also connected to the microprocessor 701. An ASIC 704 may be integrated in the MEMS device 70 or, as illustrated in FIG. 17, be arranged outside the MEMS device 70 and operatively coupled thereto.

The MEMS device 70 communicates with the microprocessor 701 via the ASIC 704.

The electronic device 700 is, for example, a mobile communication device, such as a mobile phone or a smartphone, a wearable device, such as a smartwatch, a PDA, or a computer, but may also be a voice recorder, an audio-file player with voice-recording capacity, a console for video games, and the like.

The advantages of the MEMS device described emerge clearly from the foregoing description.

In particular, the recess 78 forms a stopping structure or a lateral mechanical stopper structure that limits deformation of the deformable portion 77 and thus its deflection in the direction of the diaphragm cavity 74 in the presence of possible mechanical shocks. More particularly, a portion 72C of the body 72 of semiconductor material that is located above the recess 78 is able to flex when high deformations of the deformable portion 77 occur. For instance, in the event of a high force is applied to a surface of the deformable portion 77 at the bottom surface 74A of the diaphragm cavity 74, the deformable portion 77 moves away from the diaphragm cavity 74. Similarly, the portion 72C of the body 72 of semiconductor material above the recess 78 may flex with the deformable portion, thereby absorbing some of the force being applied to the deformable portion 77. High deformations of the deformable portion 77 may occur, for example, when the MEMS device 70 is dropped, thereby exposing the deformable portion 77 to a high impact force. The recess 78 may be any shape and may extend into the body along all sides of the cavity or any number of sides, including just one side of the cavity or along opposing sides of the cavity. Finally, it is clear that modifications and variations may be made to the device and to the method described and illustrated herein, without thereby departing from the scope of the present disclosure.

For instance, the various embodiments described may be combined to provide further solutions. In particular, the piezoelectric actuator and/or the diaphragm cavity may have a different shape, for example a regular polygonal shape.

Further, the structural layer 81 of the MEMS device 70 of FIG. 4 may be of BPSG (BoroPhosphoSilicate Glass) or other transparent materials (such as oxides); further, the passivation layer 103 may be defined simultaneously with the contact electrode 104 so as to expose the central portion of the structural layer 81. Such modifications enable use of the MEMS device 70 for instance for optical applications, such as auto-focus, retaining all the advantages listed previously.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS device, comprising:
a body having a first surface and a second surface and a first thickness between the first and second surfaces;
a cavity in the body and extending into the body from the second surface, the cavity being delimited by walls of the body;
a deformable portion in the body between the first surface and the cavity;
a piezoelectric actuator on the deformable portion; and
a recess in the walls of the body at the cavity and forming a flexible portion of the body, the flexible portion of the body being between the deformable portion and the recess, wherein the flexible portion of the body is configured to flex when a force above a particular threshold is applied to the deformable portion.

2. The device according to claim 1, wherein the body comprises a substrate of semiconductor material and a structural layer, wherein the substrate has a second thickness, the structural layer extending over the substrate and defining the first surface, the deformable portion being formed in the structural layer, and the cavity being a through opening in the substrate.

3. The device according to claim 1, wherein the cavity has a quadrangular shape, and wherein the recess is a ring-shaped recess or a polygonally-shaped recess.

4. The device according to claim 1, wherein the recess is formed by a plurality of extending parts that extend at an angular distance of 45° from each other.

5. The device according to claim 1, wherein the piezoelectric actuator is formed selectively by a region of a cylindrical shape, a region of a hollow cylindrical shape, or a region of a parallelepipedal shape.

6. The device according to claim 5, wherein the piezoelectric actuator is a plurality of actuators extending angularly spaced by 45° from each other.

7. An electronic apparatus, comprising:
a MEMS device comprising:
a semiconductor body having first and second surfaces and a through opening extending from the first and second surface, wherein walls of the through opening include a recess that is proximate the first surface, wherein the recess forms a flexible portion of the semiconductor body at the first surface;
a deformable layer on the first surface of the semiconductor body and over the through opening, the deformable layer and through opening forming a cavity; and
a piezoelectric actuator on the deformable layer; and
an ASIC coupled to the MEMS device.

8. The electronic apparatus according to claim 7, further comprising:
a memory block;
an input/output interface; and
a microprocessor coupled to the ASIC, the memory block, and the input/output interface.

9. The electronic apparatus according to claim 7, wherein the through opening and the recess of the MEMS device are concentric with each other.

10. The electronic apparatus according to claim 7, wherein the flexible portion of the semiconductor body is configured to flex when a force above a particular threshold is applied to the deformable portion.

11. The electronic apparatus according to claim 7, wherein the recess extends around a perimeter of the walls of the through opening.

12. A method for manufacturing a MEMS device, the method comprising:
forming a recess-delimitation structure within a body having a thickness in a first direction;
forming a piezoelectric actuator on a first surface of the body; and
removing a portion of the body from a second surface of the body to form a cavity extending in the thickness of the body, the cavity being inward of the recess-delimitation structure and extending through the recess-delimitation structure such that a recess is formed in walls of the cavity, the cavity delimiting a deformable portion of the body that is arranged between the first surface and the cavity.

13. The method according to claim 12, wherein forming the recess-delimitation structure comprises forming a buried cavity.

14. The method according to claim 13, wherein forming the buried cavity comprises:
forming, within a first wafer of monocrystalline semiconductor material, trenches extending from a face of the first wafer and delimiting between each other columns of semiconductor material;
epitaxially growing, from the columns, a closing layer of semiconductor material, enclosing the buried cavity, the closing layer closing the trenches at the top; and
carrying out a thermal annealing and causing migration of the semiconductor material of the columns towards the closing layer.

15. The method according to claim 13, wherein forming the buried cavity comprises:
forming a groove within a first wafer; and
bonding the first wafer to a second wafer.

16. The method according to claim 13, wherein forming the recess-delimitation structure comprises:
forming a sacrificial region on a first wafer; and
forming a covering layer extending on and adjacent to the sacrificial region, and wherein removing selective portions in the body comprises removing the sacrificial layer.

17. The method according to claim 12, wherein the recess extends in a second direction that is transverse to the first direction.

18. The method according to claim 12, wherein removing the portion of the body from the second surface forms a flexible portion between the recess and the deformable portion of the body.

* * * * *